United States Patent [19]
Boyd et al.

[11] Patent Number: 5,352,923
[45] Date of Patent: Oct. 4, 1994

[54] TRENCH RESISTORS FOR INTEGRATED CIRCUITS

[75] Inventors: John M. Boyd, Woodlawn; Joseph P. Ellul; Sing P. Tay, both of Nepean, all of Canada

[73] Assignee: Northern Telecom Limited, Montreal, Canada

[21] Appl. No.: 105,240

[22] Filed: Aug. 12, 1993

Related U.S. Application Data

[62] Division of Ser. No. 37,048, Mar. 25, 1993, Pat. No. 5,316,978.

[51] Int. Cl.$^5$ .............................................. H01L 27/02
[52] U.S. Cl. ........................... 257/536; 257/538; 257/577; 257/379
[58] Field of Search ............... 257/516, 536, 571, 622, 257/577, 379, 538

[56] References Cited

U.S. PATENT DOCUMENTS

| | | | |
|---|---|---|---|
| 3,860,465 | 1/1975 | Matzner et al. | 257/622 |
| 4,830,976 | 5/1989 | Morris et al. | 257/538 |
| 5,047,826 | 9/1991 | Keller et al. | 257/379 |
| 5,065,221 | 11/1991 | Imamura | 257/538 |

FOREIGN PATENT DOCUMENTS

2284445  11/1990  Japan .

*Primary Examiner*—Jerome Jackson
*Assistant Examiner*—Nathan K. Kelley
*Attorney, Agent, or Firm*—Angela C. de Wilton

[57] ABSTRACT

A method is provided for forming multi-valued linear resistors for an integrated circuit using a single mask level. A plurality of trenches are defined in a substrate. Each trench has contact regions of a specific lateral dimension and a narrower portion extending therebetween. Successive conformal layers of a first dielectric layer, a first conductive layer of high resistivity and a second conductive layer of lower resistivity are provided to fill the trench. The amount of the second conductive layer which fills the trench depends on the width of the trench. The resulting structure is planarized, preferably by chemical-mechanical polishing to provide fully planarized topography. Advantageously when the first and second conductive layers are provided from layers of undoped and doped polysilicon respectively, the trench dimensions control the amount of dopant incorporated in each region of the trench. After annealing to diffuse dopant, the wider end contact regions are heavily doped to form contact regions, and the intermediate narrow portion of the trench is doped to a level dependent on the width of the trench, thereby forming a resistive element having a resistivity inversely dependent on the trench width. The method is compatible with CMOS, Bipolar and Bipolar CMOS processes.

13 Claims, 8 Drawing Sheets

TRENCH RESISTORS FOR INTEGRATED CIRCUITS

This is a division of patent application Ser. No. 08/037,048, filed on Mar. 25, 1993 by J. M. Boyd, et al for "Forming Resistors For Integrated Circuits", U.S. Pat. No. 5,316,978.

FIELD OF THE INVENTION

This invention relates to resistors for integrated circuits and a method of forming resistors.

BACKGROUND OF THE INVENTION

Multi-valued linear resistors are required for applications in integrated circuits, including for example, for static random access memory (SRAM) circuits, monolithic filters, and fusible links for programmable read only memories or redundant circuits. In a known method of providing a linear resistor for a MOS, Bipolar, or Bipolar CMOS (BiCMOS) silicon integrated circuit, a layer of polysilicon is deposited over a thick layer of dielectric, for example a field oxide provided on a silicon substrate. The polysilicon layer is patterned to define a resistor structure and then selectively doped by ion implantation. Typically, the polysilicon resistor structure comprises heavily doped end regions forming contact electrodes, and a resistive region extending between the contact regions which is doped sufficiently to provide a desired resistance value.

The latter method of fabricating resistors is applicable to forming either n- or p- type ohmic resistors, particularly low and medium valued resistors for applications in MOS and bipolar digital and analog ICs. Resistors in the low to medium resistance value ranges (i.e. 10-1000 ohm/sq) are linear over a wide voltage range. High value (gigaohm) leakage current resistors, used for example in applications for high density static random access memories (SRAMS), are more difficult to fabricate reproducibly, because undoped or lightly doped polysilicon is required to obtain high resistivities. The latter is more susceptible to process induced damage and defects, which degrade quality, create leakage and lead to poor reliability.

More significantly, for a process to provide multi-valued linear resistors on an integrated circuit, the resistive portion of each resistor of a different value requires a separate implantation step, with a different dopant dose, to provide a different doping level. Thus multiple photoengraving steps are required, and the number of masks depends on the number of different values of resistors required.

SUMMARY OF THE INVENTION

The present invention seeks to provide a method of forming resistor structures for integrated circuits and a resistor structure which avoids the above mentioned problems, and with particular application to providing multi-valued linear resistors by a process with a reduced number of photoengraving steps.

According to one aspect of the present invention, there is provided a method of forming a resistively conductive element for an integrated circuit comprising: forming a steep sided trench in a surface of semiconductor substrate of an integrated circuit, the trench having contact regions of a first lateral dimension and a narrower portion extending therebetween; providing a conformal dielectric layer over sidewalls and a bottom of the trench, the dielectric layer lining the trench and leaving a cavity within the trench; providing a conformal first conductive layer of a higher resistivity material overlying the dielectric layer, and of sufficient thickness to partially fill the contact regions and at least partially fill the narrower portion of the trench; providing a second conductive layer of a lower resistivity material filling the contact regions and any unfilled part of the narrower portion of the trench; planarizing the resulting structure by selectively removing the dielectric layer and first and second conductive layers extending above the surface of the substrate; and then, annealing for a sufficient time and at temperature sufficient to cause interdiffusion of elements of the second conductive layer of lower resistivity material with elements of the first conductive layer of higher resistivity material, the first and second conductive layers thereby combining to form within the trench a conductive layer of mixed composition having low resistivity contact regions and a relatively high resistivity region in the narrower portion of the trench extending therebetween.

Thus a trench isolated resistively conductive element is provided by a method in which a single photoengraving step is required, i.e. to define the trench. Conformal layers of first and second conductive layers with different resistivities are deposited within the trench, The conductive layers are self-aligned within the trench, so that larger amounts of the second conductive layer are required to fill wider portions of the trench with the lower resistivity material. Consequently after annealing to inter-diffuse elements of the two conductive layers, a conductive element is provided in which the resistivity may be controlled by shape of the trench.

For example, the first conductive layer of a high resistivity material and the second conductive layer of lower resistivity material may comprise an undoped or lightly doped semiconductor and a relatively heavily doped semiconductor respectively. Advantageously, for example, semiconductor layers of polysilicon are provided by a known method of chemical vapour deposition. The first layer of polysilicon comprises undoped or very lightly doped polysilicon to provide a high resistivity layer. Then the second conductive layer is provided comprising heavily doped polysilicon, deposited by CVD with in situ doping.

The semiconductor layers extending above the substrate surface are removed before annealing, leaving trenches of different widths filled with different amounts of doped and undoped polysilicon. Annealing is carried out in a suitable ambient, at a temperature and for a time sufficient to diffuse dopant from the heavily doped polysilicon layer into the underlying undoped or lightly doped polysilicon layer, while avoiding diffusion into and counterdoping of the surrounding structures, i.e. the underlying dielectric or substrate. Since the first layer of undoped polysilicon is conformal in the trench, the amount of heavily doped polysilicon required to fill the trench depends on the width of the trench, the wider contact regions requiring a larger amount of heavily doped polysilicon, and the narrow portion requiring a lesser amount, or none, of the heavily doped polysilicon. Thus a larger amount of dopant from the layer of heavily doped polysilicon is incorporated in the wider portion of the trench, and after annealing forms heavily doped conductive electrodes. The narrower trench region between the contact electrodes is filled by a relatively small amount of heavily doped polysilicon, incorporating a lesser amount of dopant, so that after annealing the conductive layer in the narrower trench region is relatively lightly doped, and a relatively high resistivity conductor is provided in the narrower portion of the trench between the conductive contact regions. Thus a trench isolated layer of polysilicon is provided in which the resistivity is inversely proportional to the width of the trench.

To form a lower value resistor the narrower region of the trench is provided with a relatively large lateral dimension, and a greater amount of doped polysilicon is required to fill the trench. To form a higher value resistor required, the narrower portion may be sufficiently narrow to be filled by the first polysilicon layer only which may be undoped, or lightly doped. Thus, after removal of the polysilicon layers extending above the substrate surface, no heavily doped polysilicon is available to diffuse into this region. Thus, dopant from the heavily doped second polysilicon layer is diffused only into the end contact regions.

According to another aspect of the present invention there is provided a method of forming a plurality of multi-valued resistors for an integrated circuit comprising: forming a plurality of steep sided trenches in a surface of semiconductor substrate of an integrated circuit, each trench having first and second contact regions of a specific lateral dimension and a narrower portion extending therebetween, the narrower portion of each trench having a predetermined lateral dimension dependent on the required resistance value of the resistor to be formed therein; providing a dielectric layer over sidewalls and a bottom of each trench, the dielectric layer lining each trench and leaving a cavity within; providing a first conductive layer of a higher resistivity material over the dielectric layer of sufficient thickness to partially fill the contact regions and at least partially fill the narrower portion of each trench; providing a second conductive layer of a lower resistivity material, filling the end contact regions and any unfilled part of the narrower portion of each trench, thereby filling then narrower portions of trenches of different predetermined lateral dimensions with different relative thicknesses of the first and second conductive layers; planarizing the resulting structure by selectively removing the dielectric layer and first and second conductive layers extending above the surface of the substrate; annealing for a sufficient time and at a sufficient temperature to cause interdiffusion of dopant impurities of the second conductive layer and the first conductive layer of high resistivity material, the first and second conductive layers combining to form a conductive layer of mixed composition within the trench having lower resistivity contact regions and a relatively high resistivity region extending therebetween within the narrower portion of the trench, the resistivity value of the region within the narrow portion of each trench being inversely proportional to the predetermined lateral dimension of said narrow portion of the trench.

Thus, a series of multi-valued resistors may be formed simultaneously in the same circuit, with the same process steps, by defining a series of trenches of different lateral dimensions. As a result of self-alignment of the deposited layers within the trench and subsequent doping of the contact regions and resistive regions by diffusion, the amount of dopant is controlled by the width of the trench. Consequently, the resistance value of a resistor is dependent on width of the narrower portion of the trench. Thus the resistance values are determined in the design layout stage. A single photoengraving step is required only for defining areas for etching the trenches of different widths for each value of resistance. Conductive contact regions are provided by more heavily doped, wider regions of the trench and the requirement for an additional masking step for an implant to define electrically conductive contact electrodes is avoided.

The resulting resistive element is protected by the dielectric layer forming the trench isolation and shielded by the substrate forming the sidewalls and bottom of the trench. A layer of dielectric may be formed during the anneal step or subsequently deposited overall to complete isolation of the resistive element on 4 sides, i.e. top bottom and sidewalls. Since the resistors are formed in the early stages of processing of an integrated circuit, another conductive layer may be provided over the resistive region after providing dielectric isolation over the conductive element, to provide a resistor shield on the top of the resistive portion. The resistor shield comprises for example a conductive layer of polysilicon which may also forming emitter or gate structures of transistors of the integrated circuit. The shield protects lightly doped resistive regions from process induced damage and traps which may create leakage paths or surface inversion, and degrade performance of high value resistors. If required for high resistivity gigaohm resistors, a potential may be applied on the shield in use of the structure, to improve reliability.

According to another aspect of the present invention there is provided an integrated circuit including a plurality of resistively conductive elements, comprising: a substrate for an integrated circuit having a planar surface and defining therein a plurality of trench regions, each trench region having steep sidewalls and a bottom and comprising first and second contact regions of a specific lateral dimension and a narrower portion extending therebetween, the plurality of trenches being provided with different narrower lateral dimensions; a conformal dielectric layer extending over the sidewalls and bottom of each trench region, and a conductive layer overlying the conformal dielectric layer and filling each trench; the conductive layer and the dielectric layer having planarized surfaces substantially coplanar with the substrate surface, the planarized surface area of the conductive layer in the contact regions of each trench being sufficiently large for formation thereon of an electrical contact; and the resistivity of the conductive layer within the each trench being dependant on the lateral dimension of the trench, whereby each trench comprises low resistivity contact regions and a narrower portion of a higher resistivity which is inversely proportional to the lateral dimension of the narrower portion of the trench.

According to another aspect of the present invention there is provided an integrated circuit including a plurality of multi-valued resistors, comprising: a substrate for an integrated circuit having a planar surface and defining therein a plurality of trench regions, each trench region having steep sidewalls and a bottom and comprising first and second contact regions of a specific lateral dimension and a portion extending therebetween having a narrower lateral dimension, the plurality of trenches being provided with different narrower lateral dimensions, a conformal dielectric layer extending over the sidewalls and bottom of each trench region, and a conductive layer overlying the conformal dielectric layer and filling each trench, the conductive layer and the dielectric layers having planarized surfaces substantially coplanar with the substrate surface, the planarized surface area of the conductive layer in the contact regions of each trench being sufficiently large for formation thereon of an electrical contact, and the resistivity of the conductive layer within each trench being dependant on the lateral dimension of the trench, whereby each trench comprises low resistivity contact regions and a narrower portion of higher resistivity which is dependant on the lateral dimension of the narrower portion of the trench.

Thus multivalued resistors for an integrated circuit are provided by resistive trench isolated regions including a resistively conductive layer having a resistivity determined by trench geometry.

Thus, there is provided a method of forming a resistively conductive element for an integrated circuit, a method of forming multi-valued resistors for an integrated circuit, an integrated circuit including a plurality of multi-valued resistors, and an integrated circuit including a plurality of resistively conductive elements, in which the above mentioned problems are avoided or reduced.

BRIEF DESCRIPTION OF THE DRAWINGS

Embodiments of the invention will now be described by way of example, with reference to the accompanying drawings, in which:

FIGS. 1A and 1B shows schematic diagrams of a conventional known type of prior art resistor structure for an integrated circuit.

FIGS. 4A to 4A, 4B to 7B and 4C to 7C show corresponding cross sectional views along corresponding arrows shown in FIGS. 4 to 7.

DESCRIPTION OF THE PREFERRED EMBODIMENT

Figure 1A:
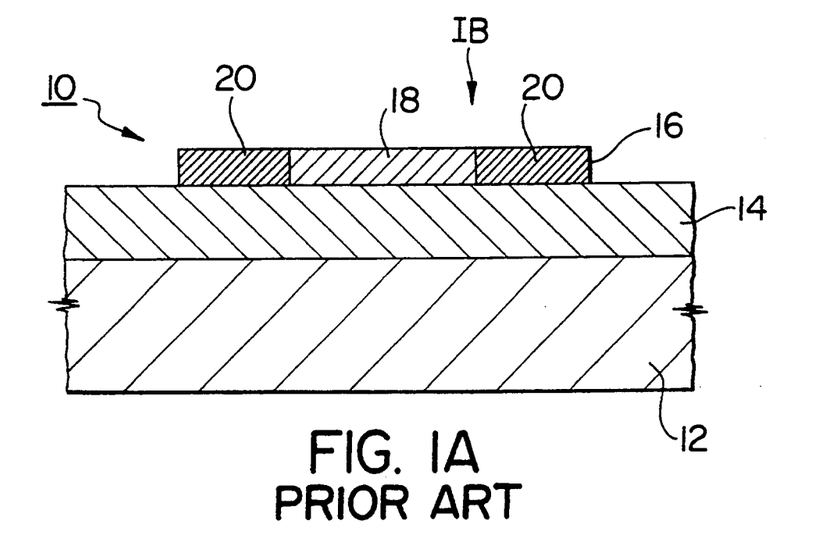
FIG. 1A shows a cross-sectional view in the direction of arrow IB in FIG. 1, through part of a semiconductor substrate wafer
Figure 1B:
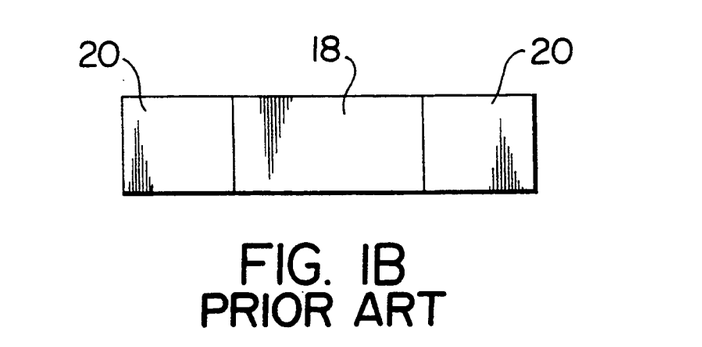
FIG. 1B shows a plan view of the surface of the resistor structure.

In a method of providing a conventional known type of resistor structure 10 for an integrated circuit (IC) as shown schematically in FIG. 1A and FIG. 1B, a substrate for an integrated circuit is provided, in the form of a silicon wafer 12 part of which is shown in FIG. 1A, on which is formed a layer 14 of a conventional dielectric isolation material, typically a field oxide comprising silicon dioxide. A layer 16 of polysilicon is deposited overall and patterned to define a resistor structure. The polysilicon layer is then p- or n- doped by ion implantation to provide a resistive portion 18 having a resistance in a desired range, and end regions 20 of the resistor structure are more heavily doped, if necessary, to provide conductive contact electrodes. Conductive terminals (not shown) are provided by a conventional metallization process. Thus two implants are required to selectively dope the end contact regions and the resistive portion respectively with different amounts of dopant. Resistors having different resistance values on the same substrate each require a different implant dose, and hence separate photoengraving and masking steps are required for each different implant.

Figure 2:
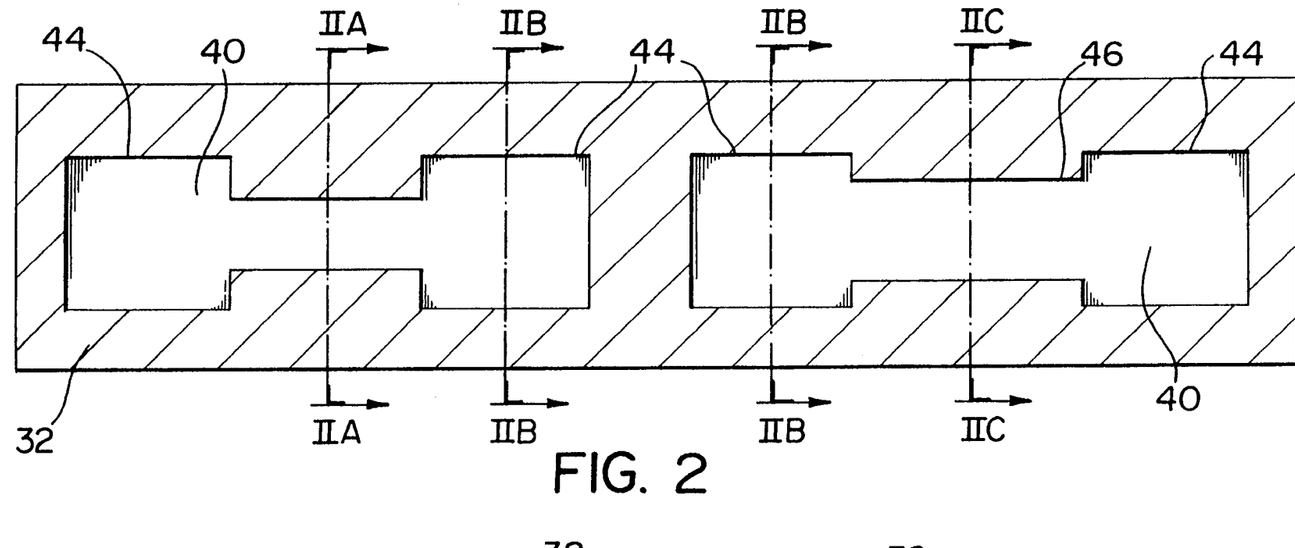
FIG. 2 shows a schematic plan view of part of an integrated circuit at an early stage of a process for forming resistor structures for an integrated circuit according to a first embodiment of the present invention.
Figure 2A:
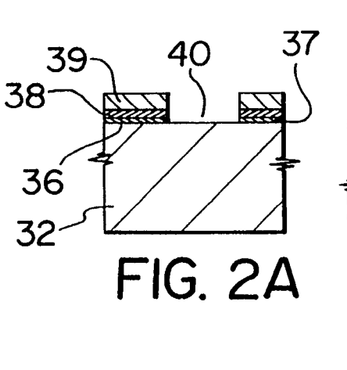
FIGS. 2A, FIG. 2B and FIG. 2C respectively show cross sectional views along arrows IIA, IIB and IIC in FIG. 2.
Figure 2B:
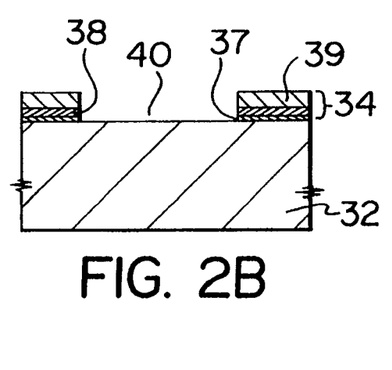
Figure 2C:
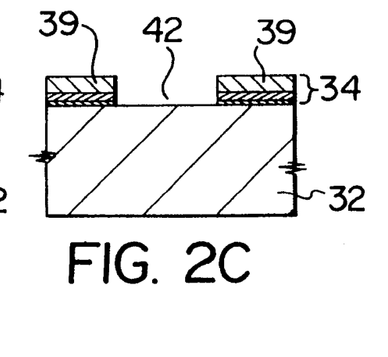
Figure 3:
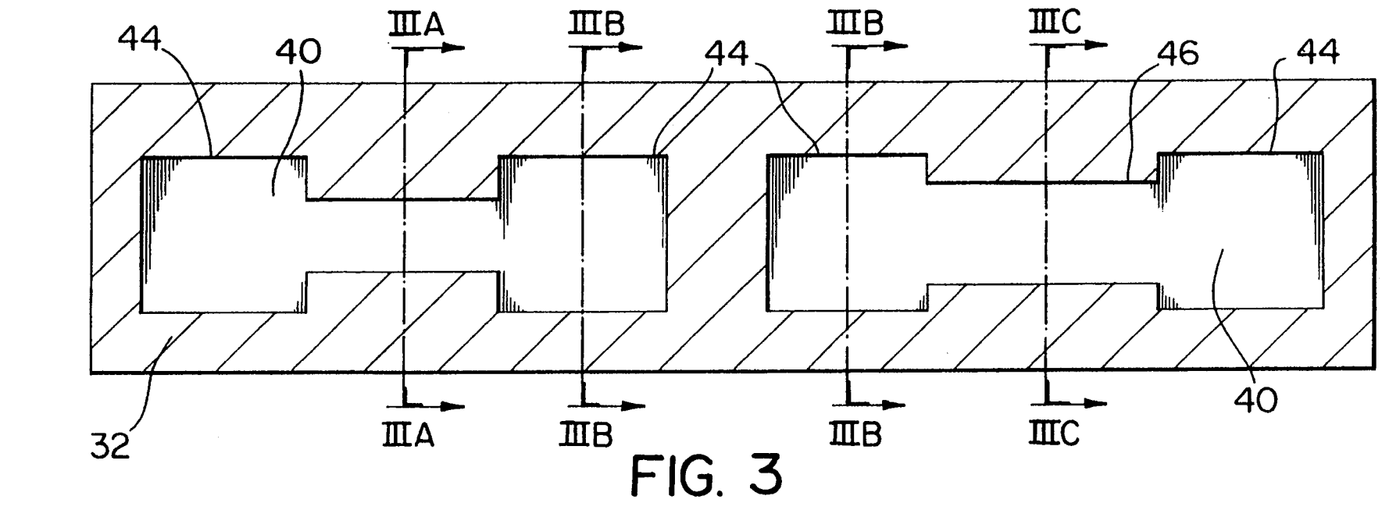
FIG. 3 shows a plan view of the structure of FIG. 2 at a later stage of a method of providing resistor structures according to the first embodiment.
Figure 3A:
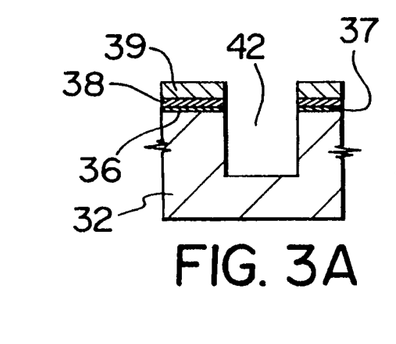
FIGS. 3A, FIG. 3B and FIG. 3C respectively show cross sectional views along arrows IIIA, IIIB and IIIC of FIG. 3.
Figure 3B:
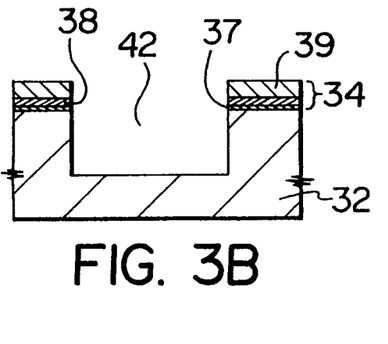
Figure 3C:
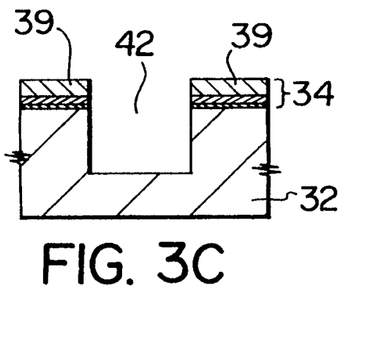
Figure 4:
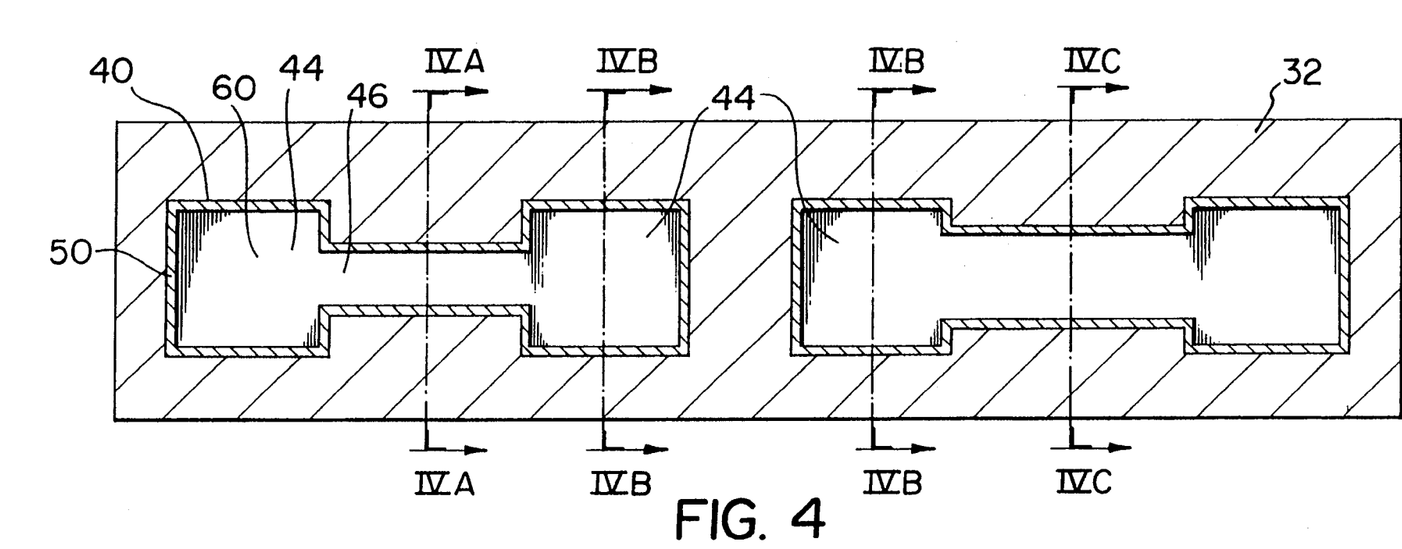
FIGS. 4 to 7 show plan views of the structure at successive steps in the method of providing resistor structures according to the first embodiment.
Figure 4A:
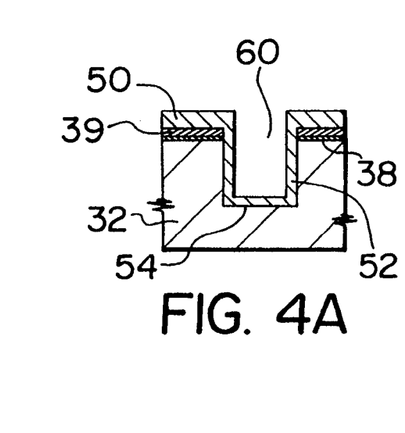
Figure 4B:
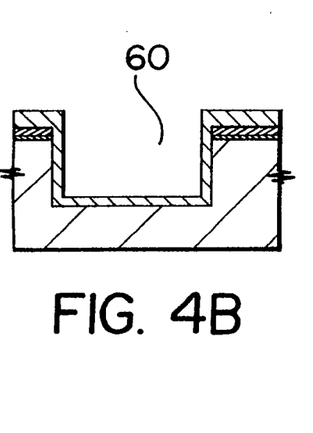
Figure 4C:
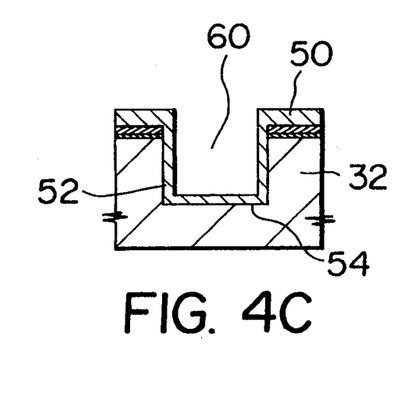

In a method of providing resistor structures according to a first embodiment of the present invention, a substrate for an integrated circuit is provided in the form of a P type, <100> semiconductor silicon wafer 32, as shown in FIGS. 2, 2A, 2B and 2C, including a masking layer 34 provided on the planar substrate surface 36. The masking layer 34 may comprise for example, a single silicon oxide layer or preferably a composite multilayer structure as shown in FIG. 2A. The composite masking layer 34 may be provided by a thin oxide layer 37, and a coating of a relatively hard masking layer 38, for example silicon nitride, which is deposited to serve as a chemical-mechanical polish stop layer, as will be described below. Then, a layer of another masking material 39, for example silicon dioxide, is grown or deposited thereon to serve as a trench etch mask. The masking layers 37, 38 and 39 are photoengraved, i.e. photo-lithographically patterned and etched, to expose regions 40 of the substrate surface for defining trenches. The exposed area 40 of the substrate surface 36 is etched by an anisotropic etching process known in the industry, to a predetermined depth to form a deep, steep-sided trench (FIG. 3). In plan view, the trenches 42 (FIG. 3) are elongated, and each have end regions 44 which are relatively wide and a narrower intermediate portion 46 extending between the end regions 44. As will be explained below, trenches for forming resistors of different values differ in the lateral dimension, i.e. width, of the narrower portion 46. The width of the narrower portion of trench is predetermined and is inversely proportional to the desired resistance value.

After a conventional post trench-etch clean, e.g., in HF solution, a dielectric isolation layer 50, for example silicon dioxide, is provided overall. The dielectric isolation layer 50 thereby conformally lines sidewalls 52 and a bottom 54 of each trench, and leaves a cavity 60 within the trench (FIGS. 4, 4A to 4C). The oxide layer 50 may be provided by a conventional method of thermal oxidation, deposition of oxide, or a composite process with a thermal oxidation step before or after deposition of an oxide layer. As an example, in a 0.8 $\mu$m BiCMOS process, the oxide layer would typically be 0.5 $\mu$m thick.

Figure 5:
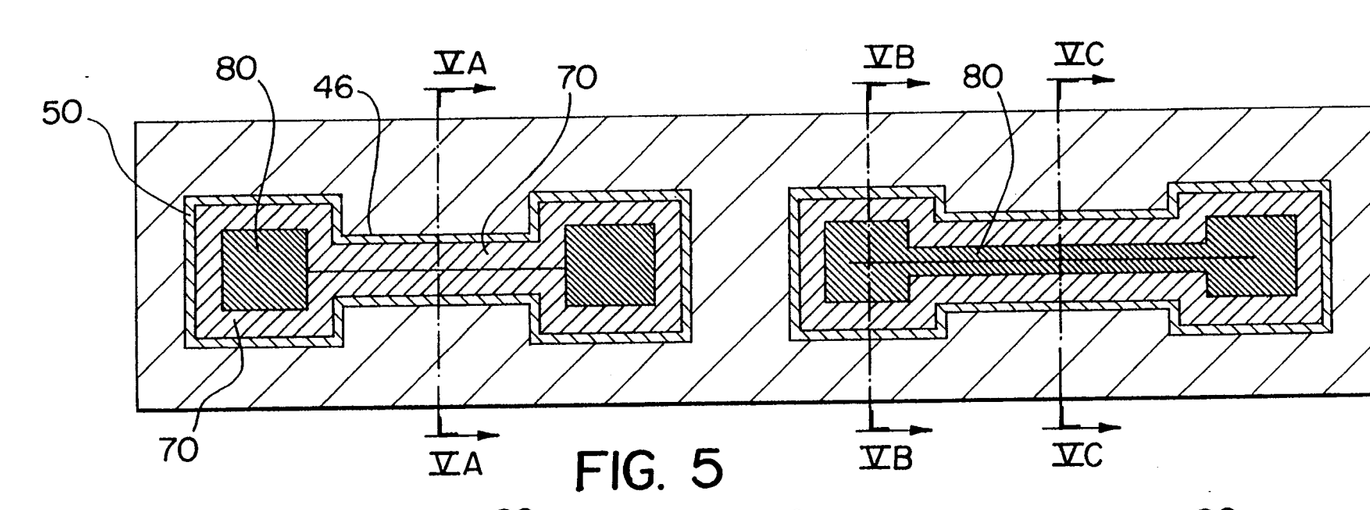
Figure 5A:
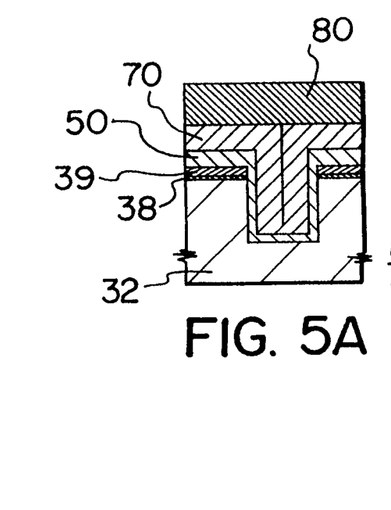
Figure 5B:
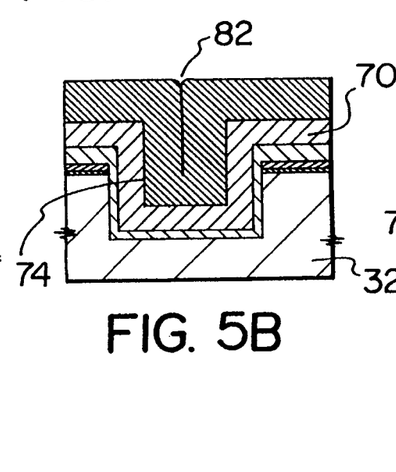
Figure 5C:
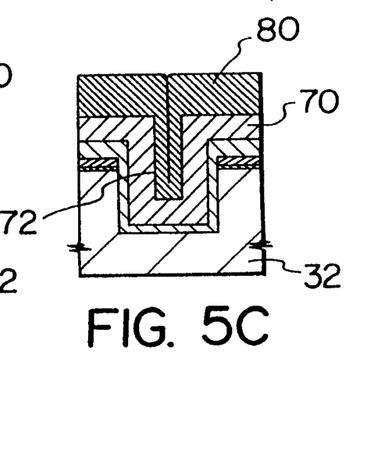
Figure 6:
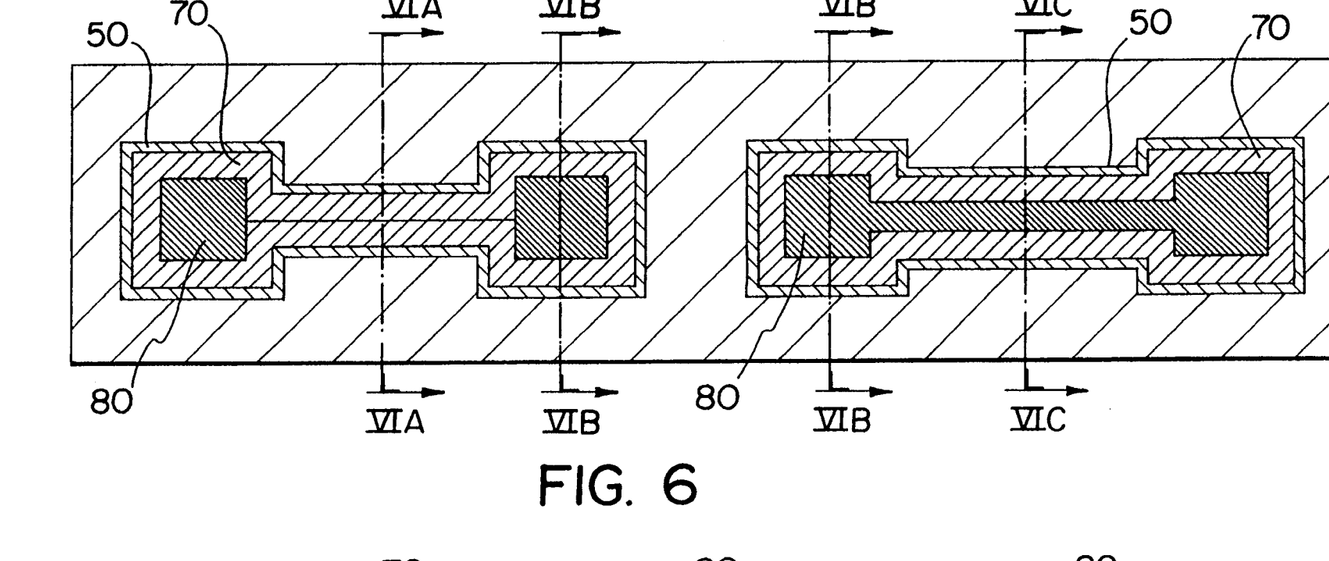
Figure 6A:
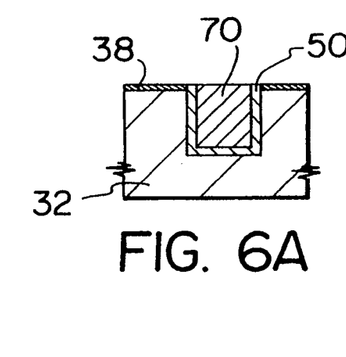
Figure 6B:
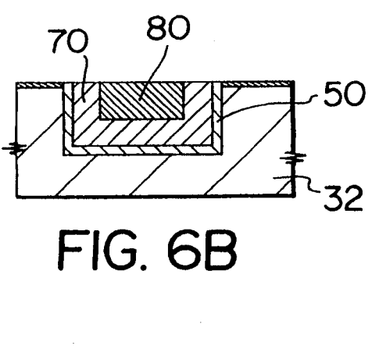
Figure 6C:
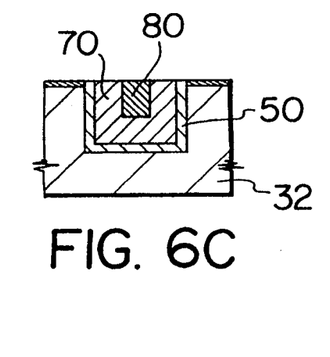
Figure 7:
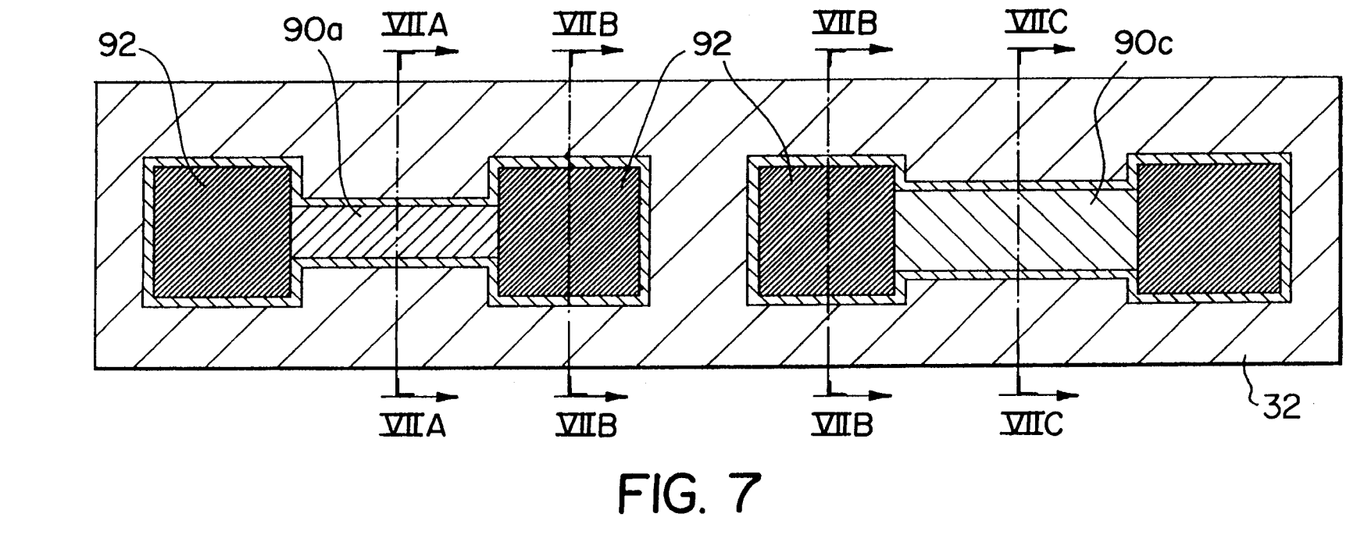
Figure 7A:
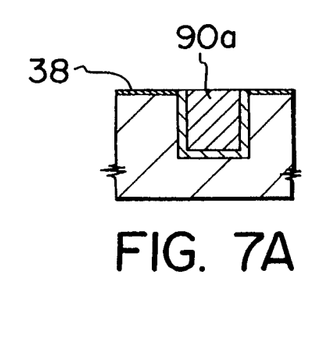
Figure 7B:
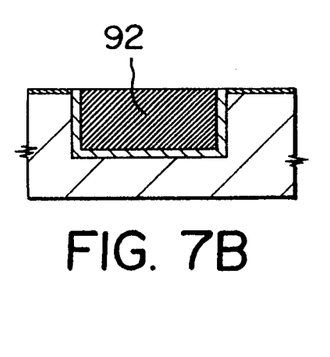
Figure 7C:
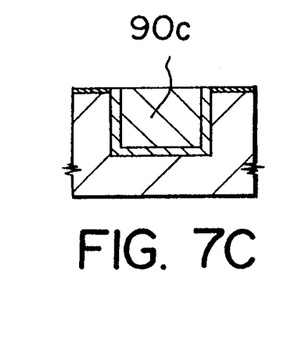

A first conductive layer of a high resistivity material, 70, for example, of a layer of an undoped or lightly doped semiconductor, i.e. polysilicon, is deposited conformally overall by a LPCVD (low pressure CVD) method known in the industry (FIG. 5). The layer of polysilicon is conformal and thickness of the polysilicon layer 70 is selected so that it only partially fills the end portions 44 of the trench 42 and leaves a cavity 74 which is filled by subsequently deposited layers.(FIG. 5B). The narrowest trench region (FIG. 5A) is completely filled by the first layer of semiconductor material. On the other hand, part 72 of the narrower portion 46 of the larger trench, shown in FIG. 5C, also remains partially unfilled by the first polysilicon layer.

Subsequently, a second conductive layer 80 having a lower resistivity is deposited conformally overall (FIGS. 5, 5A to C). The second conductive layer comprises a heavily doped semiconductor, for example a layer of polysilicon 80 which is heavily phosphorus or boron doped, as is typically used in the industry. The doped polysilicon layer 80 is, for example, formed by a conventional method of polysilicon CVD with in situ doping. A conformal polysilicon layer 80 typically leaves a depression 82 near the centre of the trench 70, and the contour of this depression is dependent on the deposition thickness and trench width. However, the thickness of the second layer is sufficient (in this example about 350 nm) that it completely fills the remaining cavity in the trench 70 above the substrate surface. Thus, the wider contact regions 44 of the trench are filled by the dielectric layer 50 and polysilicon layers 70 and 80. Each of these layers also extend over the planar surface of the masking layer 34 on the surface of the substrate 32 around the trench 42. The narrower portion 46 of the trench is filled by the first dielectric layer, the first polysilicon layer and a lesser amount or none of the second polysilicon layer (FIGS. 5A, 5B, 5C) depending on the width of the narrower portion.

Parts of the dielectric layer, and the first and second semiconductor layers, and masking layer 39 which extend above the substrate surface are selectively removed, i.e. etched back, to leave trenches filled to a level coplanar with layer 38 of chemical mechanical polish resistant material formed on the substrate surface. The resulting structure comprises dielectric isolated trenches having end contact regions filled by an undoped first polysilicon layer and a doped second polysilicon layer, and a narrower region of each trench between the end contact regions filled by the undoped first polysilicon layer, and an amount of the doped second polysilicon layer which is dependent on the width of the narrower region of the trench. The narrowest trenches may be completely filled with the first layer of polysilicon only.

Etching back is preferably performed by chemical mechanical polishing process to provide a fully planarized surface, the layer of silicon nitride layer 38 providing a suitable, relatively hard polish stop layer on the substrate surface.

After selectively removing the layers extending above the etch stop layer 38 on the silicon substrate surface, the structure is annealed. Annealing is carried out a temperature and for a time sufficient, and in a suitable ambient, to diffuse dopant from the doped polysilicon layer into the underlying undoped polysilicon layer only, to avoid counterdoping of the surrounding substrate. For example, annealing is carried out in an oxygen ambient at 850° C. to 1000° C., which forms a $SiO_2$ layer on the exposed polysilicon and prevents outdiffusion of dopant. During annealing dopant diffuses from the heavily doped polysilicon layer into the first polysilicon layer thereby forms a conductive layer 90. The conductive layer 90 within each trench comprises polysilicon in which the doping in the wider end contact regions is greater than the doping of the narrower portion of the trench extending in between. The width of the contact regions is sufficiently large that the amount of dopant incorporated in the end region provides a heavily doped, low resistivity contact electrode region. The narrower portion is of a sufficient width to incorporate a lesser amount of dopant, providing a resistive portion of the structure with a required resistance value. The amount of dopant incorporated in the trench is proportional to the lateral dimension (width) the trench.

There is no heavily doped polysilicon in the narrowest trench regions 90a. Thus there is no dopant available to diffuse during annealing. The resistivity of the undoped or lightly doped first polysilicon layer filling the narrow region determines the resistance of this region, thereby forming a high value resistor. Wider trench regions 90c, and the end contact regions 92, contain more of the second layer of doped polysilicon, and thus more dopant is available to diffuse, during annealling, into the underlying undoped or lightly doped first polysilicon layer. Diffusion of dopant from the more heavily doped polysilicon layer into the underlying polysilicon layer thus forms a region with a resistivity related to the width of the trench, to provide a lower value resistor.

After annealing, a layer of dielectric, e.g. silicon dioxide may be provided over the polysilicon layer by a conventional method, i.e. either by thermal oxidation, or by deposition. Then, contacts are provided by conventional metallization steps, for example by a standard CMOS multilevel metal process.

Thus the process allows for simultaneously forming a plurality of resistors of different values, using only one mask level to define a plurality of trenches of different lateral dimensions. The requirement for multiple photoengraving and implantation steps to form multi-valued resistors on an integrated circuit is completely avoided.

Since each layer filling the trench is conformal, and thus, in effect, self-aligned within the trench, the structure and electrical characteristics of each resistor structure is dependent upon the geometry of the trench. The process uses a unconventional circuit design approach in which the resistivity value of a resistor is defined by the trench dimensions. Additional photo-lithographic steps are not required to define the contact electrode, and consequently a single planarization step only is required after filling the trench with a plurality of conductive and dielectric layers. The number of mask levels used for complex analog BiCMOS process can be reduced. Furthermore, the process allows for formation of resistive elements, or local interconnect conductors, at the initial stages of processing, while retaining substrate wafer planarity. Coplanar contacts are provided to both electrodes without topography related photoengraving problems.

The resistor structure is naturally shielded on the sides and bottom of the trench by the substrate forming the trench sidewalls and bottom the trench. Extraneous effects due to charges along the top, sides or bottom of a conventional resistor structure formed by a known method are reduced or avoided.

Figure 8:
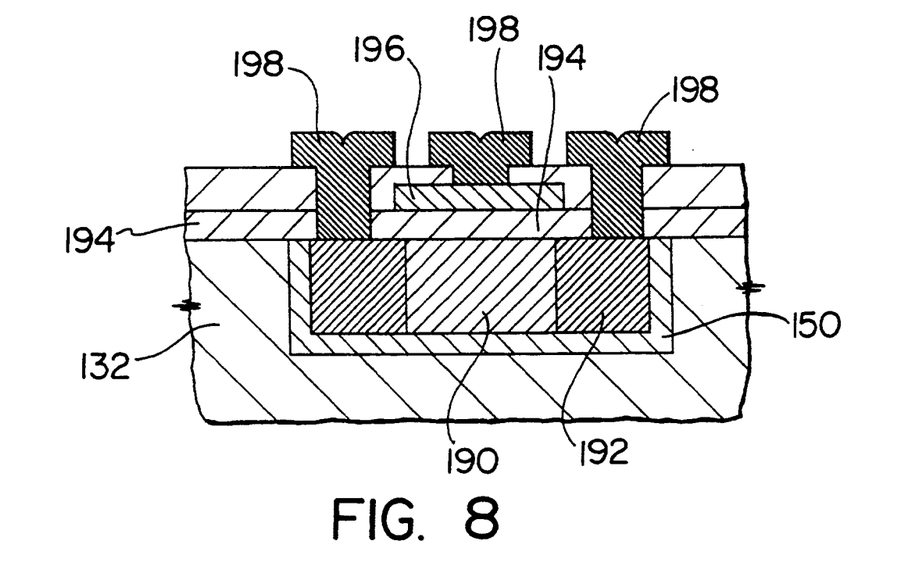
FIG. 8 shows a cross sectional view through part of an integrated circuit comprising a resistor structure according to a second embodiment of the present invention.

In a method of forming a resistively conductive element for an integrated circuit according to a second embodiment of the present invention, as shown in FIG. 8, steep-sided trenches are provided in the substrate 132, as described in the first embodiment, having wider contact regions and a relatively narrow portion extending in between. The trench is lined with a layer of dielectric 150. Conformal layers of a first conductive layer and a second conductive layer comprising undoped and doped polysilicon respectively are provided within the trench. After planarizing and annealing similarly as described in the first embodiment to provide a conductive layer 190 having a resistive portion in the narrow portion of the trench having heavily doped contact regions 192. Subsequently, a dielectric layer 194, e.g. oxide, is grown or deposited on the polysilicon layer 190, followed by another layer of polysilicon 196, for example a deposited layer of about 0.35 μm thick polysilicon. The latter may, for example, be a polysilicon layer which forms gate or emitter structures of transistors of the integrated circuit. The polysilicon cap 196 acts as a resistor shield for all subsequent oxide and metal deposition, silicidation, and etch steps, all of which include exposure to the resistor structure to a plasma ambient. A conventional three level metal interconnect is used to complete the structure and provides contacts 198 to the resistor contact regions and the polysilicon shield.

Thus, the resistor is not only shielded by the substrate on the sides and bottom of the trench, a further polysilicon shield layer is provided on top of the resistive region. The shielded resistor structure is particularly applicable for providing high value resistors (gigaohm).

The incorporation of shields early in the processing protects sensitive undoped or lightly doped polysilicon devices from damage, e.g. plasma radiation induced damage during etching, which lead to poor reproducibility or reliability in high value resistances. devices. Furthermore, in use of the resistor, the top polysilicon shield may function as a gate to which a potential may be provided for controlling induced charges which may otherwise tend to cause leakage paths in high value resistors.

In other modifications of the embodiments of the invention, the dielectric layer of silicon dioxide is formed compositely by thermal oxidation following deposition. Alternatively, other known insulating materials are used instead of CVD silicon dioxide, for example, a layer of silicon nitride or silicon oxynitride formed by a known method of oxidation, thermal oxidation or an ONO (oxide-nitride-oxide composite) process, or a metal oxide such as tantalum pentoxide.

The chemical-mechanical polish stop layer alternatively comprises other hard polish resistant materials, for example, silicon carbide. Since the polish stop material must be more polish resistant than the conductive or insulating layers, silicon carbide may be advantageous to improve polish selectivity.

In the embodiment described above, the trench etch masking layer 39 is preferably removed during the chemical mechanical polishing step along with the overlying dielectric layer 50 which may comprise the same material, and the conductive layers extending above polish stop layer 38 on the substrate surface.

Other conventional etch back methods for planarization, for example, reactive ion etching may be used. However, planarization by chemical-mechanical polishing is particularly advantageous in providing a fully planarized surface topography. In particular, coplanar contacts to two or more electrodes can then be made readily, thus simplifying subsequent process steps and reducing topography related photoengraving and etch problems in defining conductive interconnect structures, particularly for deep submicron (i.e. <0.5 μm) technology.

It will be apparent from the embodiments described that other trench isolated resistively conductive elements may be provided within the scope of the invention by modifying or varying the process steps of the embodiments. Other ohmic circuit elements formed according to the method of the embodiment and having a controlled low resistivity include buried local interconnect conductors and DC conductive rails. A maskless process for forming buried isolated polysilicon fuses, for example, adapted from the first embodiment described above includes providing a highly resistive element of undoped or lightly doped polysilicon, and subsequently, after the step of etching back the structure level with the substrate surface surface, a thin conductive layer, e.g. of titanium silicide, is provided on the surface of highly resistive polysilicon in the narrow region of the trench.

Incorporation of a resistively conductive structure in an integrated circuit is primarily at the design level rather than at the processing level. Additional layers or special layers not required. Various IC device structures may be incorporated at an early stage of processing, without altering the baseline process technology.

Thus complex analog BiCMOS circuits may be fabricated with a reduced number of mask levels and process steps, thus reducing processing costs.

Although particular embodiments of the invention have been described in detail, it should be appreciated that numerous modifications, variations and adaptations may be made without departing from the scope of the invention as defined in the claims.

What is claimed is:

1. An integrated circuit having a plurality of resistors of different resistance values,
   each resistor comprising a trench defined in a substrate of the integrated circuit, the trench having steep sidewalls and a bottom, lined with a conformal layer of a dielectric material and the trench being shaped to provide first and second contact portions having a specific lateral dimension, and a resistive portion extending lengthwise therebetween having a relatively narrow lateral dimension, each portion of the trench being filled with conductive material;
   said conductive material filling each portion of the trench comprising a semiconductor material having a concentration of dopant in proportion to the lateral dimension of each portion and determining the resistivity of each portion, thereby providing low resistivity contact portions and a higher resistivity resistive portion; and
   each individual resistor having a resistive portion of a predetermined lateral dimension providing a corresponding resistance value, whereby individual resistors having a different lateral dimension of the resistive portion provide resistances in inverse proportion to the lateral dimension of the resistive portion.

2. An integrated circuit according to claim 1 wherein the conductive layer comprises polysilicon.

3. An integrated circuit according to claim 1 wherein the conductive material filling portions of the trench has a planarized surface substantially coplanar with the substrate surface and the planarized surface provides for formation thereon of coplanar electrical contacts to each of the contact portions.

4. An integrated circuit according to claim 1 wherein the conductive comprises doped polysilicon, comprising first and second conformal layers of polysilicon deposited in two stages whereby an interface exist between first and second conformal layers of polysilicon.

5. A structure according to claim 1 wherein the dielectric is selected from the group consisting of silicon dioxide, silicon nitride, and silicon oxynitride.

6. An integrated circuit including a plurality of resistively conductive elements, each comprising:
   a trench defined in a substrate of the integrated circuit, the trench having steep sidewalls and a bottom, lined with a conformal layer of dielectric, and the trench being shaped to provide first and second contact portions of a first lateral dimension and a resistive portion extending therebetween and having a relatively narrow lateral dimension, each portion of the trench being filled with a conductive material;
   said conductive material filling each portion of the trench comprising a semiconductor material having a concentration of dopant in proportion to the lateral dimension of each portion of the trench and determining the resistivity of each portion, thereby providing low resistivity contact portions and a higher resistivity resistive portion; and
   each individual resistive element having a resistive portion of a predetermined lateral dimension providing a corresponding resistance value, whereby individual resistive elements of different lateral dimensions of the resistive portion provide resistance values in inverse proportion to the lateral dimension of said resistive portion.

7. An integrated circuit having a plurality of resistors of different resistance values,
   each resistor comprising a trench defined in an integrated circuit substrate, the trench having steep sidewalls and a bottom, lined with a layer of a dielectric material, the trench being shaped to provide first and second contact portions having a specific lateral dimension, and a resistive portion extending therebetween having a relatively narrow lateral dimension, and each portion of the trench being filled with a conductive material;
   said conductive material filling each portion of the trench region and having a composition dependent on the lateral dimension of each portion of the trench, whereby the resistivity of the conductive material is inversely proportional to the lateral dimension of said portion of the trench, thereby providing low resistivity contact portions and a higher resistivity resistive portion; and,
   each resistor having a resistive portion of a predetermined lateral dimension providing a corresponding resistance value, and individual resistors differing in the lateral dimension of the resistive portion providing resistance values in inverse proportion to the lateral dimension of the resistive portion.

8. An integrated circuit according to claim 7 wherein the conductive layer filling each portion of the trench comprises a semiconductor material having a concentration of dopant in proportion to the lateral dimension of each portion.

9. An integrated circuit according to claim 8 wherein the semiconductor comprises polysilicon.

10. An integrated circuit according to claim 7 wherein each trench is elongate and uniform in depth, and each lateral dimension comprises a width of the trench, the contact portions being provided by wider end portions and the resistive portion extending lengthwise therebetween having a relatively narrow width, each of the plurality of resistors being provided with a resistive portion of a predetermined width to provide a corresponding resistance value, and
   resistors of different resistance values thereby differing in the width of the respective resistive portion.

11. An integrated circuit according to claim 7 wherein the conductive material filling portions of the trench has a planarized surface substantially coplanar with the substrate surface and the planarized surface provides for formation thereon of coplanar electrical contacts to each of the contact portions.

12. An integrated circuit according to claim 7 wherein individual resistors comprise a gate electrode defined by another conductive layer overlying the resistive portion and isolated therefrom by an intervening gate dielectric layer.

13. An integrated circuit according to claim 7 wherein the dielectric layer comprises a conformally deposited layer of dielectric lining the sidewalls and bottom of the trench and isolating the conductive material from the substrate.

* * * * *